(12) United States Patent
Xiong et al.

(10) Patent No.: US 11,211,022 B2
(45) Date of Patent: Dec. 28, 2021

(54) GOA CIRCUIT AND DRIVING METHOD THEREOF, GOA DRIVING CIRCUIT, AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Xin Xiong, Beijing (CN); Xiong Xiong, Beijing (CN); Hengzhen Liang, Beijing (CN); Rongcheng Liu, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 833 days.

(21) Appl. No.: 16/060,677

(22) PCT Filed: Oct. 25, 2017

(86) PCT No.: PCT/CN2017/107689
§ 371 (c)(1),
(2) Date: Jun. 8, 2018

(87) PCT Pub. No.: WO2018/176823
PCT Pub. Date: Oct. 4, 2018

(65) Prior Publication Data
US 2021/0166648 A1    Jun. 3, 2021

(30) Foreign Application Priority Data
Mar. 30, 2017 (CN) .......................... 201710203914.1

(51) Int. Cl.
*G09G 3/36* (2006.01)

(52) U.S. Cl.
CPC ....... *G09G 3/3677* (2013.01); *G09G 2330/08* (2013.01)

(58) Field of Classification Search
CPC ................. G09G 3/3677; G09G 2330/08
See application file for complete search history.

(56) References Cited

U.S. PATENT DOCUMENTS 10,262,572 B2 * 4/2019 Long .................... G09G 3/2092
2002/0075248 A1 6/2002 Morita et al.
(Continued)

FOREIGN PATENT DOCUMENTS

CN    104866141 A    8/2015
CN    105976755 A    9/2016
(Continued)

OTHER PUBLICATIONS

Feb. 1, 2018—(WO) International Search Report and Written Opinion Appn PCT/CN2017/107689 with English Translation.
(Continued)

*Primary Examiner* — Benyam Ketema
(74) *Attorney, Agent, or Firm* — Banner & Witcoff, Ltd.

(57) ABSTRACT

The present application provides a GOA circuit, a GOA circuit driving method, a GOA driving circuit and a display device, the GOA circuit includes: a front-end GOA circuit, which is connected to a connection signal input terminal, a reset signal terminal, a first power supply voltage terminal, and a second power supply voltage terminal, a third power supply voltage terminal, a clock signal terminal, and a front-end output terminal, and is configured to output a clock signal at the clock signal terminal to the front-end output terminal when an input signal at the signal input terminal is at an active input level; and a repair circuit, which is (Continued)

connected to the front-end output terminal, a frame start signal, the first power supply voltage terminal, and an output terminal of the GOA circuit.

15 Claims, 7 Drawing Sheets

(56) References Cited

U.S. PATENT DOCUMENTS

| | | | |
|---|---|---|---|
| 2011/0157030 A1 | 6/2011 | Xu | |
| 2011/0292007 A1* | 12/2011 | Ohhashi | G11C 19/28 345/204 |
| 2012/0293401 A1* | 11/2012 | Li | G11C 19/184 345/100 |
| 2012/0293737 A1* | 11/2012 | Li | G11C 19/184 349/42 |
| 2015/0187312 A1* | 7/2015 | Dai | G09G 3/3648 345/213 |
| 2015/0206488 A1* | 7/2015 | Zhang | G09G 3/3648 345/92 |
| 2015/0279289 A1* | 10/2015 | Yu | G11C 19/28 345/690 |
| 2015/0280704 A1* | 10/2015 | Wu | G09G 3/3677 345/100 |
| 2015/0339999 A1* | 11/2015 | Zheng | G09G 3/3677 345/92 |
| 2016/0275895 A1* | 9/2016 | Dai | G09G 3/36 |
| 2017/0069286 A1* | 3/2017 | Wu | G09G 3/20 |
| 2017/0153742 A1 | 6/2017 | Pang et al. | |
| 2017/0256223 A1* | 9/2017 | Du | G09G 3/3677 |
| 2018/0025687 A1 | 1/2018 | Wang | |
| 2018/0190232 A1* | 7/2018 | Xue | G09G 3/3677 |
| 2018/0301075 A1* | 10/2018 | Zhou | G09G 3/20 |

FOREIGN PATENT DOCUMENTS

| | | |
|---|---|---|
| EP | 0177247 A2 | 4/1986 |
| EP | 0909975 A2 | 4/1999 |
| WO | 2010116778 A1 | 10/2010 |

OTHER PUBLICATIONS

Jul. 6, 2020—(EP) Extended European Search Report Appn 17898348.2.

* cited by examiner

```
┌─────────────────────────────────────────────────┐
│ when the frame start signal is at an active input │  S701
│ level, a pulse at the front-end output terminal of the │
│ front-end GOA circuit is output to the output terminal │
│      of the GOA circuit by the repair circuit     │
└─────────────────────────────────────────────────┘
                         │
                         ▼
┌─────────────────────────────────────────────────┐
│ when the frame start signal is at an inactive input │ S702
│ level, the output terminal of the GOA circuit is made │
│ no output by the repair circuit so that the GOA circuit │
│            is in the non-output state             │
└─────────────────────────────────────────────────┘
```

FIG. 7

GOA CIRCUIT AND DRIVING METHOD THEREOF, GOA DRIVING CIRCUIT, AND DISPLAY DEVICE

The application is a U.S. National Phase Entry of International Application No. PCT/CN2017/107689 filed on Oct. 25, 2017, designating the United States of America and claiming priority to Chinese Patent Application No. 201710203914.1 filed on Mar. 30, 2017. The present application claims priority to and the benefit of the above-identified applications and the above-identified applications are incorporated by reference herein in their entirety.

TECHNICAL FIELD

The present disclosure relates to the technical field of display, and more particularly, to a GOA (Gate Driver on Array) circuit having a self-repair function and a driving method thereof, a GOA driving circuit comprising the GOA circuit, and a display device comprising the GOA driving circuit.

BACKGROUND

At present, gate driving devices are generally formed on an array substrate of a liquid crystal display by an array process, that is, a Gate Driver on Array (GOA) process. This integrating process saves costs and is a development trend of TFT-LCD in the future.

GOA circuit still has a lot of aspects that need improvement. At present, most of GOA circuit output abnormalities are GOA circuits with multiple outputs (Multi-Output). If the GOA circuit can achieve the function of self-repairing Multi-Output through its own design, product yield is improved, product's anti-interference ability is improved, product quality and reliability is improved, on the other hand, design margin (Margin) is improved, thereby increasing design adjustability and reducing design difficulty.

The GOA circuit is intended to replace the function of the gate driver IC and achieve a reduction of cost. At present, the function of the GOA circuit has not been as comprehensive and stable as that of the gate driver IC. Due to instability in the process and requirements for panel timing of customer system, GOA circuits are likely to cause abnormal outputs due to a variety of reasons, that is, Multi-Output conditions. Once Multiple-Output occurs, due to the cascade characteristics of GOA circuits, the operation of the entire GOA circuit will be affected, which causes AD (Abnormal Display) failure. The existing design does not have a repair circuit for self-repairing Multi-Output, thus the GOA circuit is extremely sensitive to abnormal operation signals and cannot repair it (it can be retrieved through reboot).

SUMMARY

Additional aspects and advantages of the present disclosure will be set forth in part in the description which follows, and in part will be obvious from the description, or may be learned by practice of the disclosure.

In the present disclosure, a repair circuit is added at the back-end of the front-end GOA circuit. At the beginning of each frame, the frame start signal STV can turn on a first repair control transistor M12, and charge a reset node RE of the GOA circuit on each row of gates. When the front-end GOA circuit outputs Multiple-Output, since the reset node RE is at a high level at this time, a second repair control transistor M13 is turned on, and the output of the front-end output terminal is normally output in the first frame. At the same time, the output of the front-end output terminal can turn on a third repair control transistor M14, thereby pulling down the level of the reset node RE, turning off the second repair control transistor M13, and shielding other abnormal outputs, so as to achieve the self-repair function under abnormal outputs.

The present disclosure provides a Gate Driver on Array GOA circuit comprising a front-end GOA circuit which is connected to a signal input terminal, a reset signal terminal, a first power supply voltage terminal, a second power supply voltage terminal, a third power supply voltage terminal, a clock signal terminal, and a front-end output terminal, and is configured to output a clock signal at the clock signal terminal to the front-end output terminal when an input signal at the signal input terminal is at an active input level; and a repair circuit which is connected to the front-end output terminal, a frame start signal, the first power supply voltage terminal, and an output terminal of the GOA circuit, and is configured to output a pulse at the front-end output terminal to the output terminal of the GOA circuit when the frame start signal is at an active input level; and to make the output terminal of the GOA circuit having no output so that the GOA circuit is in a non-output state when the frame start signal is at an inactive input level.

Hereinto, the repair circuit comprises: a first repair control transistor having a gate and a first electrode respectively connected to the frame start signal, and a second electrode connected to a reset node; a second repair control transistor having a gate connected to the reset node, a first electrode connected to the front-end output terminal, and a second electrode connected to the output terminal of the GOA circuit; a first capacitor having a first terminal connected to the reset node; and a third repair control transistor having a gate connected to the output terminal of the GOA circuit at the next stage, a first electrode connected to a second terminal of the first capacitor, and a second electrode connected to the first power supply voltage terminal.

Hereinto, the front-end GOA circuit comprises: an input circuit, which is connected to the signal input terminal and the pull-up node, and is configured to transfer the received input signal to the pull-up node when the input signal of the signal input terminal is at an active input level; a reset circuit which is connected to the reset signal terminal, the first power supply voltage terminal and the pull-up node, and is configured to pull down the pull-up signal at the pull-up node to the power supply voltage at the first power supply voltage terminal when the reset signal at the reset signal terminal is at an active control level; a pull-down control circuit which is connected to the second power supply voltage terminal, the third power supply voltage terminal, the pull-up node, the pull-down node, and the first power supply voltage terminal, and is configured to control whether the pull-down circuit operates; a pull-down circuit which is connected to the pull-down node, the pull-up node, the first power supply voltage terminal and the front-end output terminal, and is configured to pull down the voltages of the front-end output terminal and the pull-up node to the power supply voltage of the first power supply voltage terminal when the pull-down signal at the pull-down node is at an active pull-down level; and an output circuit, which is connected to the clock signal terminal, the pull-up node, and the front-end output terminal, and is configured to output the clock signal of the clock signal terminal to the front-end output terminal when the pull-up signal at the pull-up node is at an active pull-up level.

Hereinto, the input circuit comprises: an input transistor having a gate and a first electrode respectively connected to the signal input terminal, and a second electrode connected to a pull-up node.

Hereinto, the reset circuit comprises: a reset transistor having a gate connected to the reset signal terminal, a first electrode connected to the pull-up node, and a second electrode connected to the first power supply voltage terminal.

Hereinto, the pull-down control circuit comprises a first pull-down control circuit and a second pull-down control circuit, wherein the pull-down node includes a first pull-down node and a second pull-down node.

Hereinto, the first pull-down control circuit comprises: a first pull-down control transistor having a gate connected to a first pull-down control node, a first electrode connected to the second power supply voltage terminal, and a second electrode connected to the first pull-down node; a second pull-down control transistor having a gate connected to the pull-up node, a first electrode connected to the first pull-down node, and a second electrode connected to the first power supply voltage terminal; a third pull-down control transistor having a gate and a first electrode respectively connected to the second power supply voltage terminal, and a second electrode connected to the first pull-down control node; and a fourth pull-down control transistor having a gate connected to the pull-up node, a first electrode connected to the first pull-down control node, and a second electrode connected to the first power supply voltage terminal, the second pull-down control circuit includes: a fifth pull-down control transistor having a gate connected to the second pull-down control node, a first electrode connected to the third power supply voltage terminal, and a second electrode connected to the second pull-down node; a sixth pull-down control transistor having a gate connected to the pull-up node, a first electrode connected to the second pull-down node, and a second electrode connected to the first power supply voltage terminal; a seventh pull-down control transistor having a gate and a first electrode respectively connected to the third power supply voltage terminal, and a second electrode connected to the second pull-down control node; and an eighth pull-down control transistor having a gate connected to the pull-up node, a first electrode connected to the second pull-down control node, and a second electrode connected to the first power supply voltage terminal.

Hereinto, the pull down circuit includes a first pull down circuit and a second pull down circuit.

The first pull down circuit comprises: a first node pull-down transistor having a gate connected to the first pull-down node, a first electrode connected to the pull-up node, and a second electrode connected to the first power supply voltage terminal; and a first output pull-down transistor having a gate connected to the first pull-down node, a first electrode connected to the front-end output terminal, and a second electrode connected to the first power supply voltage terminal; the second pull-down circuit includes: a second node pull-down transistor having a gate connected to the second pull-down node, a first electrode connected to the pull-up node, and a second electrode connected to the first power supply voltage terminal; and a second output pull-down transistor having a gate connected to the second pull-down node, a first electrode connected to the front-end output terminal, and a second electrode connected to the first power supply voltage terminal.

Hereinto, the output circuit comprises: an output transistor having a gate connected to the pull-up node, a first electrode connected to the clock signal terminal, and a second electrode connected to the front-end output terminal; and a second capacitor having a first terminal connected to the pull-up node and a second terminal connected to the front-end output terminal.

Hereinto, at the beginning of each frame, the frame start signal is at an active input level.

The present disclosure further provides a method of driving a GOA circuit, the GOA circuit comprising the GOA circuit described above, the method comprising: when the frame start signal is at an active input level, the repair circuit outputting a pulse at the front-end output terminal of the front-end GOA circuit to the output terminal of the GOA circuit; and when the frame start signal is at an inactive input level, the repair circuit making the output terminal of the GOA circuit having no output so that the GOA circuit is in a non-output state.

The present disclosure further provides a GOA driving circuit comprising N GOA units connected in cascade, said N GOA units being a first GOA unit to an Nth GOA unit, each GOA unit being the GOA unit described above, where N is an integer greater than or equal to two.

The present disclosure further provides a GOA driving circuit comprising N GOA circuits connected in cascade, said N GOA circuits being a first GOA circuit to an Nth GOA circuit, each GOA circuit being the GOA circuit described above, where N is an integer greater than or equal to two.

Hereinto, among said N GOA circuits connected in cascade, the signal input terminal of the first GOA circuit is connected to the frame start signal, and the reset signal terminal of the Nth GOA circuit is connected to the frame start signal; the signal input terminal of each GOA circuit of the second GOA circuit to the Nth GOA circuit is connected to the output terminal of the GOA circuit at the previous stage adjacent thereto, the reset signal terminal of each GOA circuit of the first GOA circuit to the N-1th GOA circuit is connected to the output terminal of the GOA at the next stage adjacent thereto.

Hereinto, in the GOA driving circuit, the frame start signal is input to each stage of GOA circuit.

The present disclosure further provides a display device including the GOA driving circuit described above.

BRIEF DESCRIPTION OF THE DRAWINGS

The above and other objects, features, and advantages of the present disclosure will become more apparent from the following detailed description of preferred embodiments of the present disclosure with reference to the attached drawings, in which like reference signs designate like structures or circuits and in which.

DETAILED DESCRIPTION OF THE EMBODIMENTS

The present disclosure will be fully described below with reference to the accompanying drawings that illustrate embodiments of the present disclosure. However, the present disclosure may be embodied in many different forms and should not be construed as limited to the embodiments described herein. Rather, these embodiments are provided so that this disclosure will be thorough and complete, and will fully convey the scope of the disclosure to those skilled in the art. In the drawings, the components are exaggerated for clarity.

Transistors used in all embodiments of the present disclosure may be thin film transistors or field effect transistors or other devices with the same characteristics. In the present embodiment, the connection mode of the drain and the source of each transistor can be interchanged, and therefore, the drain and the source of each transistor in the embodiment of the present disclosure have no difference substantially. Here, only for distinguishing between two other electrodes except for the gate of the transistor, one of the electrodes is called a drain and the other is called a source. The thin film transistor used in the embodiment of the present disclosure may be an N-type transistor or a P-type transistor. In the embodiment of the present disclosure, when an N-type thin film transistor is used, the first electrode may be a source, and the second electrode may be a drain. In the following embodiments, an example in which the thin film transistor is an N-type transistor is described. That is, when the signal of the gate is high, the thin film transistor is turned on. It can be conceived that when a P-type transistor is used, the timing of the driving signal needs to be adjusted accordingly.

Figure 1:
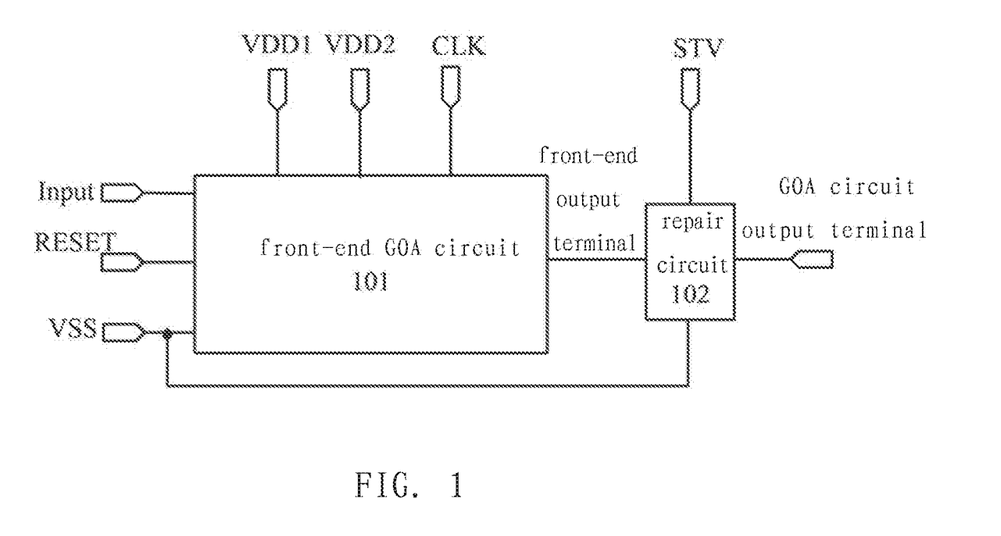
FIG. 1 shows a block diagram of a single GOA circuit having a self-repair function according to an embodiment of the present disclosure.

FIG. 1 shows a block diagram of a single GOA circuit having a self-repair function according to an embodiment of the present disclosure.

As shown in FIG. 1, in one embodiment, the GOA circuit comprises a front-end GOA circuit 101 and a repair circuit 102. In the GOA circuit according to the present disclosure, a repair circuit 102 is added after the output terminal of the front-end GOA circuit 101.

In one embodiment, for example, the front-end GOA circuit 101 is connected to a signal input terminal Input, a reset signal terminal RESET, a first power supply voltage terminal VSS, a second power supply voltage terminal VDD1, a third power supply voltage terminal VDD2, a clock signal terminal CLK, and a front-end output terminal. The front-end GOA circuit 101 is configured to output the clock signal of the clock signal terminal CLK to the front-end output terminal when the input signal Input of the signal input terminal is at an active input level.

In one embodiment, for example, the repair circuit 102 is connected to the front-end output terminal of the front-end GOA circuit 101, a frame start signal STV, the first power supply voltage terminal VSS, and a output terminal of the GOA circuit, and is configured to output a pulse at the front-end output terminal to the output terminal of the GOA circuit when the frame start signal STV is at an active input level; and to make the output terminal of the GOA circuit having no output so that the GOA circuit is in a non-output state when the frame start signal STV is at an inactive input level. Thus, a GOA circuit according to the present disclosure can filter out abnormal output and interference signal.

Among them, the first power supply voltage terminal VSS is a low power supply voltage terminal. The second and third power supply voltage terminals VDD1 and VDD2 are high power supply voltage terminals.

Figure 2A:
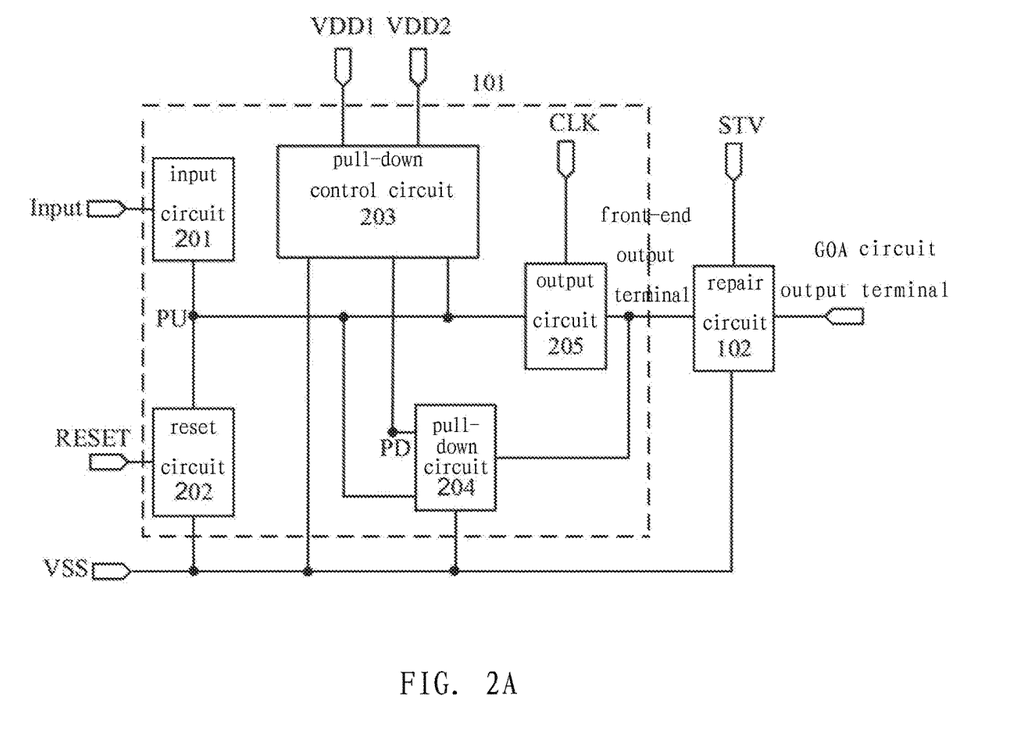
FIG. 2A shows a structure diagram of a single GOA circuit having a self-repair function according to an embodiment of the present disclosure.

FIG. 2A shows a structure diagram of a single GOA circuit having a self-repair function according to an embodiment of the present disclosure.

As shown in FIG. 2A, in one embodiment, for example, the front-end GOA circuit 101 includes an input circuit 201, a reset circuit 202, a pull-down control circuit 203, a pull-down circuit 204, and an output circuit 205.

The input circuit 201 is connected to the signal input terminal Input and a pull-up node PU, and is configured to transfer the received input signal to the pull-up node PU when the input signal Input of the signal input terminal is at an active input level.

The reset circuit 202 is connected to the reset signal terminal RESET, the first power supply voltage terminal VSS, and the pull-up node PU, and is configured to pull down the pull-up signal at the pull-up node PU to the power supply voltage of the first power supply voltage terminal VSS, when the reset signal of the reset signal terminal RESET is at an active control level.

The pull-down control circuit 203 is connected to the second power supply voltage terminal VDD1, the third power supply voltage terminal VDD2, the pull-up node PU, the pull-down nodes PD1 and PD2, and the first power supply voltage terminal VSS, and is configured to control whether the pull-down circuit 204 operates. For example, the pull-down control circuit 203 generates a pull-down signal having an inactive pull-down level at the pull-down node PD, when the pull-up signal at the pull-up node PU is at an active pull-up level; and provides the high-level voltage signal VDD1 or VDD2 to the pull-down nodes PD1 and PD2 in response to the high-level voltage signal VDD1 or VDD2, when the pull-up signal at the pull-up node PU is at an inactive pull-up level.

The pull-down circuit 204 is connected to the pull-down node PD, the pull-up node PU, the first supply voltage terminal VSS, and the front-end output terminal, and is configured to pull down the front-end output terminal and the pull-up node PU to the power supply voltage of the first power supply voltage terminal VSS, when the pull-down signal at the pull-down node PD is at an active pull-down level.

The output circuit 205 is connected to the clock signal terminal CLK, the pull-up node PU, and the front-end output terminal, and is configured to output the clock signal of the clock signal terminal CLK to the front-end output terminal when the pull-up signal at the pull-up node PU is at an active pull-up level.

The repair circuit 102 is connected to the front-end output terminal, the frame start signal STV and the output terminal of the GOA circuit, and is configured to output a pulse at the front-end output terminal to the output terminal of the GOA circuit after the frame start signal STV comes, and in other time periods, to make the output terminal of the GOA circuit having no output, so that the GOA circuit is in a non-output state.

Figure 2B:
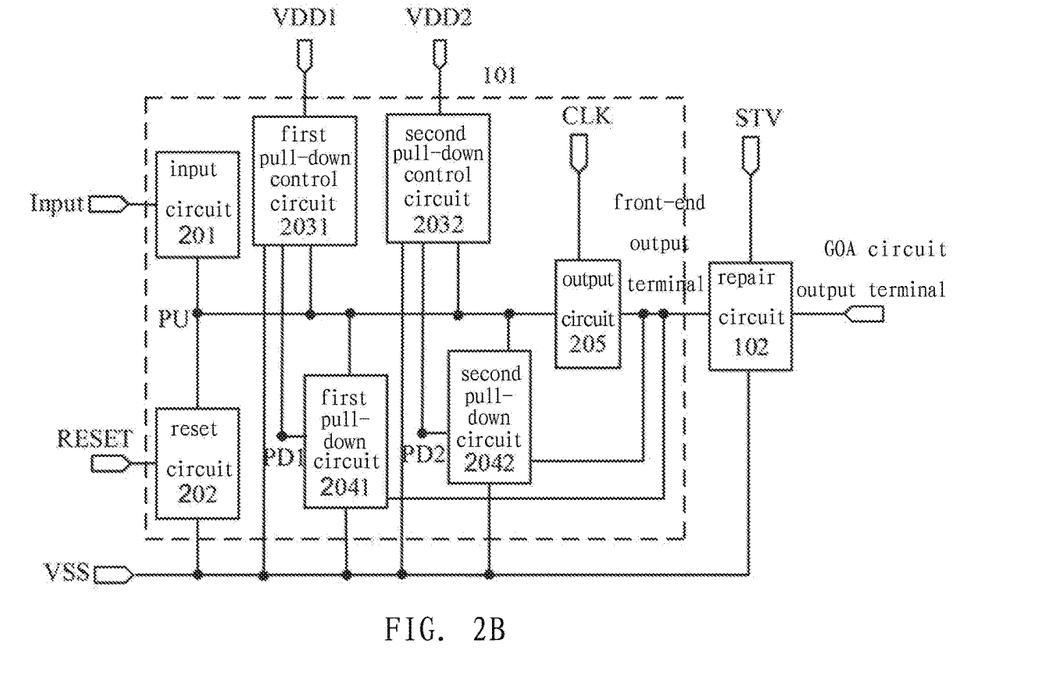
FIG. 2B shows a detailed block diagram of the single GOA circuit of FIG. 2A.

FIG. 2B shows a detailed block diagram of the single GOA circuit of FIG. 2.

As shown in FIG. 2B, the pull-down control circuit 203 includes a first pull-down control circuit 2031 and a second pull-down control circuit 2032, and the pull-down node PD includes a first pull-down node PD1 and a second pull-down node PD2.

The pull-down circuit 204 includes a first pull-down circuit 2041 and a second pull-down circuit 2042.

The first pull-down control circuit 2031 is connected to the second power supply voltage terminal VDD1, the pull-up node PU, the first pull-down node PD1, and the first power supply voltage terminal VSS, and is configured to control whether the first pull-down circuit 2041 operates. For example, the first pull-down control circuit 2031 generates a pull-down signal having an inactive pull-down level at the first pull-down node PD1, when the pull-up signal at the pull-up node PU is at an active pull-up level; and provides the high-level voltage signal VDD1 to the first pull-down nodes PD1 in response to the high-level voltage signal VDD1, when the pull-up signal at the pull-up node PU is at an inactive pull-up level.

The second pull-down control circuit 2032 is connected to the third power supply voltage terminal VDD2, the pull-up node PU, the second pull-down node PD2, and the first power supply voltage terminal VSS, and is configured to control whether the second pull-down circuit 2042 operates. For example, the second pull-down control circuit 2032 generates a pull-down signal having an inactive pull-down level at the second pull-down node PD2, when the pull-up signal at the pull-up node PU is at an active pull-up level; and provides the high-level voltage signal VDD2 to the second pull-down nodes PD2 in response to the high-level voltage signal VDD2, when the pull-up signal at the pull-up node PU is at an inactive pull-up level.

The first pull-down circuit 2041 is connected to the first pull-down node PD1, the pull-up node PU, the first power supply voltage terminal VSS, and the front-end output terminal, and is configured to pull down the front-end output terminal and the pull-up node PU to the power supply voltage of the first power supply voltage terminal VSS, when the pull-down signal at the first pull-down node PD1 is at an active pull-down level.

The second pull-down circuit 2042 is connected to the second pull-down node PD, the pull-up node PU, the first power supply voltage terminal VSS, and the front-end output terminal, and is configured to pull down the front-end output terminal and the pull-up node PU to the power supply voltage of the first power supply voltage terminal VSS, when the pull-down signal at the second pull-down node PD2 is at an active pull-down level.

Figure 3:
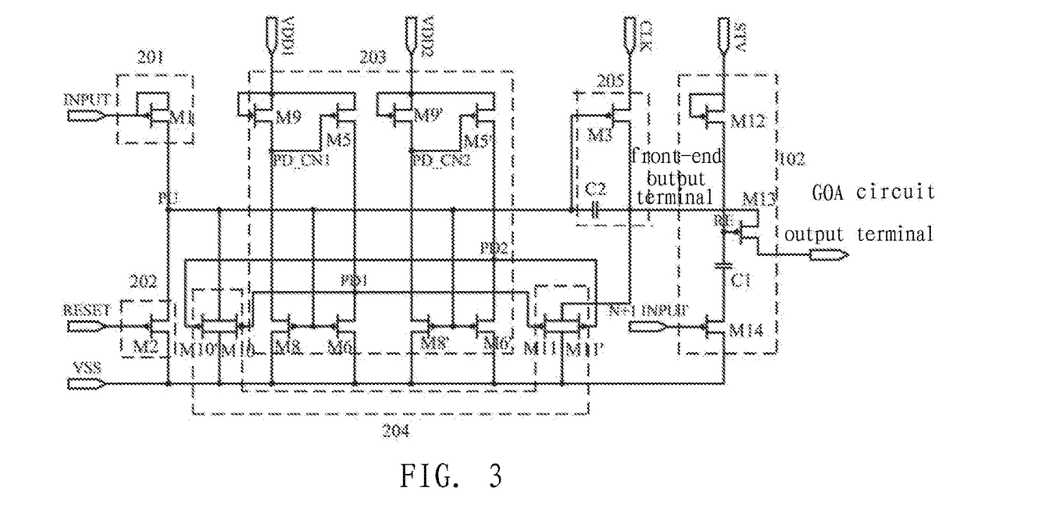
FIG. 3 shows an example circuit diagram of a single GOA circuit having a self-repair function according to an embodiment of the present disclosure.

FIG. 3 shows an example circuit diagram of a single GOA circuit having a self-repair function according to an embodiment of the present disclosure.

In the following, the transistors in FIG. 3 are all described as examples of an N-type transistor, which is turned on when the gate is input with a high level.

As shown in FIG. 3, in one embodiment, for example, the input circuit 201 includes an input transistor M1, a gate and a first electrode of the input transistor M1 are respectively connected to the signal input terminal INPUT, and a second electrode of the input transistor M1 is connected to the pull-up node PU. When the input signal of the signal input terminal INPUT is at a high level, the input transistor M1 is turned on, and the input signal of the signal input terminal INPUT is transferred to the pull-up node PU. The specific implementation structure, control method, etc. of the input circuit 201 do not limit the embodiments of the present disclosure.

In one embodiment, for example, the reset circuit 202 includes a reset transistor M2. A gate of the reset transistor M2 is connected to a reset signal terminal RESET, a first electrode of the reset transistor M2 is connected to the pull-up node PU, and a second electrode of the reset transistor M2 is connected to the first power supply voltage terminal VSS. When the reset signal at the reset signal terminal RESET is at the high level, the reset transistor M2 is turned on, and the pull-up signal at the pull-up node PU is pulled down to the power supply voltage of the first power supply voltage terminal VSS. The reset circuit 202 described above is only an example and it may have other structures.

In one embodiment, for example, the pull-down control circuit 203 includes a first pull-down control circuit 2031 and a second pull-down control circuit 2032, and the pull-down node PD includes a first pull-down node PD1 and a second pull-down node PD2.

The first pull-down control circuit 2031 includes a first pull-down control transistor M5, a second pull-down control transistor M6, a third pull-down control transistor M9, and a fourth pull-down control transistor M8. The gate of the first pull-down control transistor M5 is connected to the first pull-down control node PD_CN1, the first electrode of the first pull-down control transistor M5 is connected to the second power supply voltage terminal VDD1, and the second electrode of the first pull-down control transistor M5 is connected to the first pull-down node PD1; the gate of the second pull-down control transistor M6 is connected to the pull-up node PU, the first electrode of the second pull-down control transistor M6 is connected to the first pull-down node PD1, and the second electrode of the second pull-down control transistor M6 is connected to the first power supply voltage terminal VSS; and the gate and the first electrode of the third pull-down control transistor M9 are respectively connected to the second power supply voltage terminal VDD1, the second electrode of the third pull-down control transistor M9 is connected to the first pull-down control node PD_CN1; and the gate of the fourth pull-down control transistor M8 is connected to the pull-up node PU, the first electrode of the fourth pull-down control transistor M8 is connected to the first pull-down control node PD CN1, and the second electrode of the fourth pull-down control transistor M8 is connected to the first power supply voltage terminal VSS.

The second pull-down control circuit 2032 includes a fifth pull-down control transistor M5', a sixth pull-down control transistor M6', a seventh pull-down control transistor M9', and an eighth pull-down control transistor M8'. The gate of the fifth pull-down control transistor M5' is connected to the second pull-down control node PD_CN2, the first electrode of the fifth pull-down control transistor M5' is connected to the third power supply voltage terminal VDD2, and the second electrode of the fifth pull-down control transistor M5' is connected to the second pull-down node PD2; the gate of the sixth pull-down control transistor M6' is connected to the pull-up node PU, the first electrode of the sixth pull-down control transistor M6' is connected to the second pull-down node PD2, and the second electrode of the sixth pull-down control transistor M6' is connected to the first power supply voltage terminal VSS; the gate and the first electrode of the seventh pull-down control transistor M9' are respectively connected to the third power supply voltage terminal VDD2, and the second electrode of the seventh pull-down control transistor M9' is connected to the second pull-down control node PD_CN2; and the gate of the eighth pull-down control transistor M8' is connected to the pull-up node PU, the first electrode of the eighth pull-down control transistor M8' is connected to the second pull-down control node PD_CN2, and the second electrode of the eighth pull-down control transistor M8' is connected to the first power supply voltage terminal VSS.

In one embodiment, for example, the pull-down circuit 204 includes a first pull-down circuit 2041 and a second pull-down circuit 2042.

The first pull-down circuit 2041 includes a first node pull-down transistor M10 and a first output pull-down transistor M11. The gate of the first node pull-down transistor M10 and the gate of the first output pull-down transistor M11 are connected to the first pull-down node PD1. The second electrode of a node pull-down transistor M10 and the second electrode of the first output pull-down transistor M11 are connected to the first power supply voltage terminal VSS, the first electrode of the first node pull-down transistor M10 is connected to the pull-up node PU, and the first electrode of the first output pull-down transistor M11 is connected to the front-end output terminal. When the pull-down signal at the first pull-down node PD1 is at the high level, the first node pull-down transistor M10 and the first output pull-down transistor M11 are turned on, to pull down the pull-up node PU and the front-end output terminal to the power supply voltage of the first power supply voltage terminal VSS respectively.

The second pull-down circuit 2042 includes a second node pull-down transistor M10' and a second output pull-down transistor M11'. The gate of the second node pull-down transistor M10' and the gate of the second output pull-down transistor M11' are connected to the second pull-down node PD2. The second electrode of the second node pull-down transistor M10' and the second electrode of the second output pull-down transistor M11' are connected to the first power supply voltage terminal VSS, the first electrode of the second node pull-down transistor M10' is connected to the pull-up node PU, and the first electrode of the second output pull-down transistor M11' is connected to the front-end output terminal. When the pull-down signal at the second pull-down node PD2 is at a high level, the second node pull-down transistor M10' and the second output pull-down transistor M11' are turned on, to pull down the pull-up node PU and the front-end output terminal to the power supply voltage of the first power supply voltage terminal VSS respectively.

The pull-down control circuit 203 and the pull-down circuit 204 described above are merely examples, which may also have other structures.

In one embodiment, for example, the output circuit 205 includes an output transistor M3 and a second capacitor C2. The gate of the output transistor M3 is connected to the pull-up node PU. The first electrode of the output transistor M3 is connected to the clock signal terminal CLK. The second electrode of the output transistor M3 is connected to the front-end output terminal; the first terminal of the second capacitor C2 is connected to the pull-up node PU, and the second terminal of the second capacitor C2 is connected to the front-end output terminal. When the pull-up signal at the pull-up node PU is at the high level, the output transistor M3 is turned on, and the second clock signal at the clock signal terminal CLK is output to the front-end output terminal.

The above-described output circuit 205 is only an example, and it may also have other structures.

In one embodiment, for example, the repair circuit 102 includes a first repair control transistor T12, a second repair control transistor T13, a third repair control transistor T14, and a first capacitor C 1. The gate and the first electrode of the first repair control transistor T12 are connected to the frame start signal STV, and the second electrode of the first repair control transistor T12 is connected to the reset node RE. The gate of the second repair control transistor T13 is connected to the reset node RE, the first electrode of the second repair control transistor T13 is connected to the front-end output terminal, and the second electrode of the second repair control transistor T13 is connected to the output terminal of the GOA circuit. The first terminal of the first capacitor C1 is connected to the reset node RE, and the second terminal of the first capacitor C1 is connected to the first electrode of the third repair control transistor T14. The gate of the third repair control transistor T14 is connected to the output terminal of the GOA circuit at the next stage, and the second electrode of the third repair control transistor T14 is connected to the first power supply voltage terminal VSS.

At the beginning of each frame, the frame start signal STV turns on the first repair control transistor M12 and charges the reset node RE of the GOA circuit of each row of gates. When the front-end GOA circuit outputs Multiple-Output, since the reset node RE is at high level at this time, the second repair control transistor M13 is turned on, and the output of the front-end output terminal of the first frame is normally output. At the same time, the output of the front-end output terminal turns on the third repair control transistor M14, thereby pulling down the level of the reset node RE, turning off the second repair control transistor M13, and shielding other abnormal outputs, so as to achieve the self-repair function under abnormal output.

The above-mentioned repair circuit 102 is only an example, and it may also have other structures capable of achieving the same function.

The function of the repair circuit 102 is implemented as follows:

At the beginning of each frame, the frame start signal STV causes the first repair control transistor M12 of each row GOA circuit to be turned on, charges the reset node RE, and maintains the high level through the first capacitor C1.

The reset node RE is set to a high level so that the second repair control transistor M13 maintains an ON state.

At this time, the output of the front-end output passes through the second repair control transistor M13 in the ON state, and outputs a pulse to the output terminal of the GOA circuit.

After the front-end output terminal outputs the pulse, the third repair control transistor M14 is turned on inversely, so as to pull down the voltage of the reset node RE.

The voltage of the reset node RE is set low, turning off the second repair control transistor M13.

Since the second repair control transistor M13 is turned off, the row GOA circuit locks the non-output state before the next frame start signal STV arrives.

Figure 4:
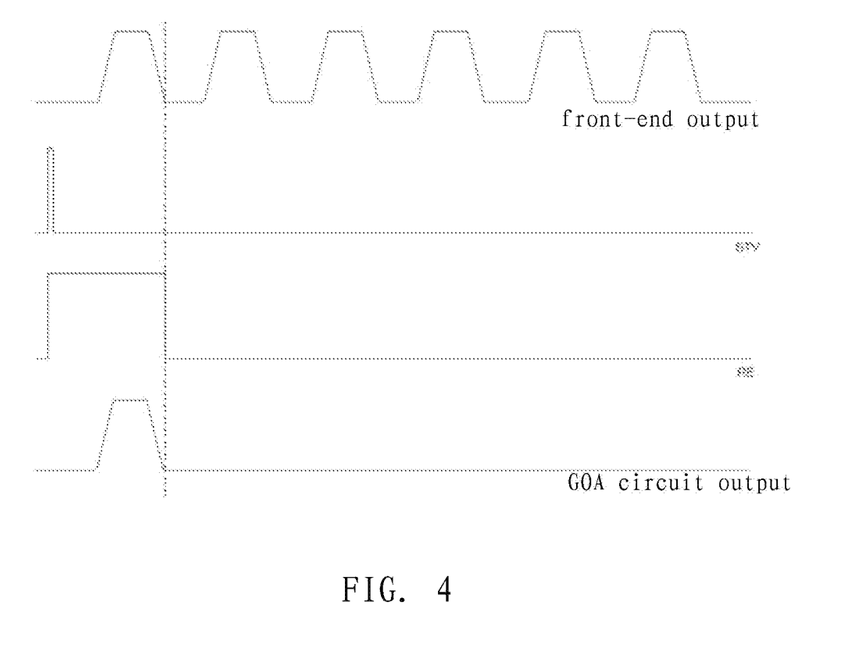
FIG. 4 shows a timing diagram of a GOA circuit having a self-repair function when the GOA circuit is abnormal according to an embodiment of the present disclosure.

FIG. 4 shows a timing diagram of a GOA circuit having a self-repair function when the GOA circuit is abnormal according to an embodiment of the present disclosure.

Figure 5:
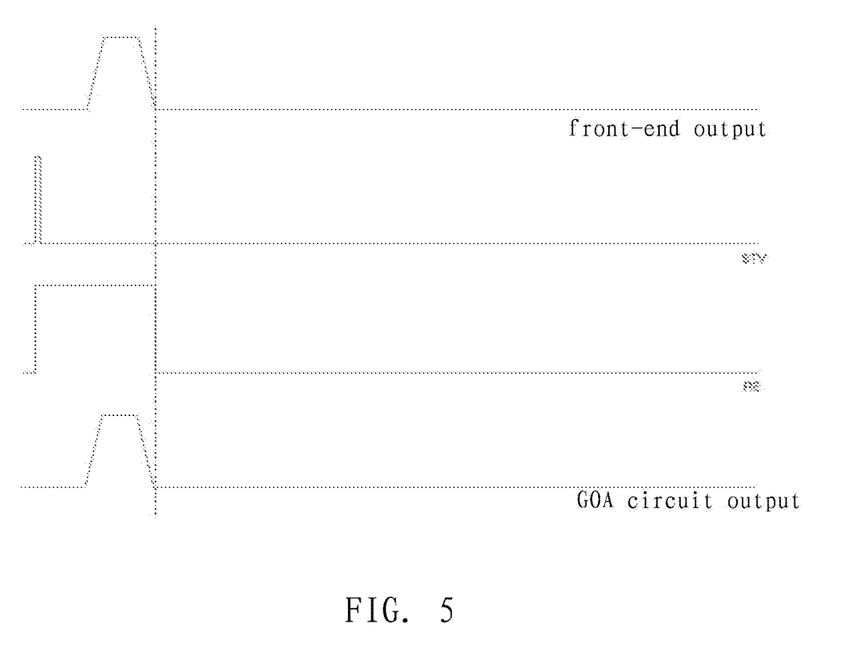
FIG. 5 shows a timing diagram of a GOA circuit having a self-repair function when the GOA circuit is normal according to an embodiment of the present disclosure; FIG.

FIG. 5 shows a timing diagram of a GOA circuit having a self-repair function when the GOA circuit is normal according to an embodiment of the present disclosure.

Referring to FIG. 4, the front-end output terminal of the front-end GOA circuit outputs abnormally, that is, has a plurality of outputs. During the front-end output terminal outputs the first pulse, the STV turns on the first repair control transistor M12 to charge the reset node RE. The reset node RE is set to a high level so that the second repair control transistor M13 maintains an ON state. At this time, the output of the front-end output terminal passes through the second repair control transistor M13 in the ON state, and outputs a pulse to the output terminal of the GOA circuit.

After the front-end output terminal outputs the pulse, the third repair control transistor M14 is turned on inversely, so as to pull down the voltage of the reset node RE. The voltage of the reset node RE is set low, turning off the second repair control transistor M13. Therefore, the reset output terminal is in a non-output state until the next frame start signal STV arrives. Therefore, even if a Multi-Output malfunction appears at the front-end output terminal, the Multiple-Output problem can be repaired by the repair circuit.

That is, a driving method of a GOA circuit according to an embodiment of the present disclosure includes: outputting a pulse of a front-end output terminal of a front-end GOA to an output terminal of a GOA circuit when a frame start signal is at an active input level, and making the output terminal of the GOA circuit having no output so that the GOA circuit is in a non-output state when the frame start signal is at an inactive input level.

Referring to FIG. 5, no abnormality appears at the front-end output terminal of the front-end GOA circuit in FIG. 5. At this time, the reset output terminal maintains the normal output of the front-end output terminal.

As can be seen from the timing diagrams of FIG. 4 and FIG. 5, the GOA circuit with the self-repair function according to an embodiment of the present disclosure can well solve the problem of abnormal Multiple-Output.

Figure 6:
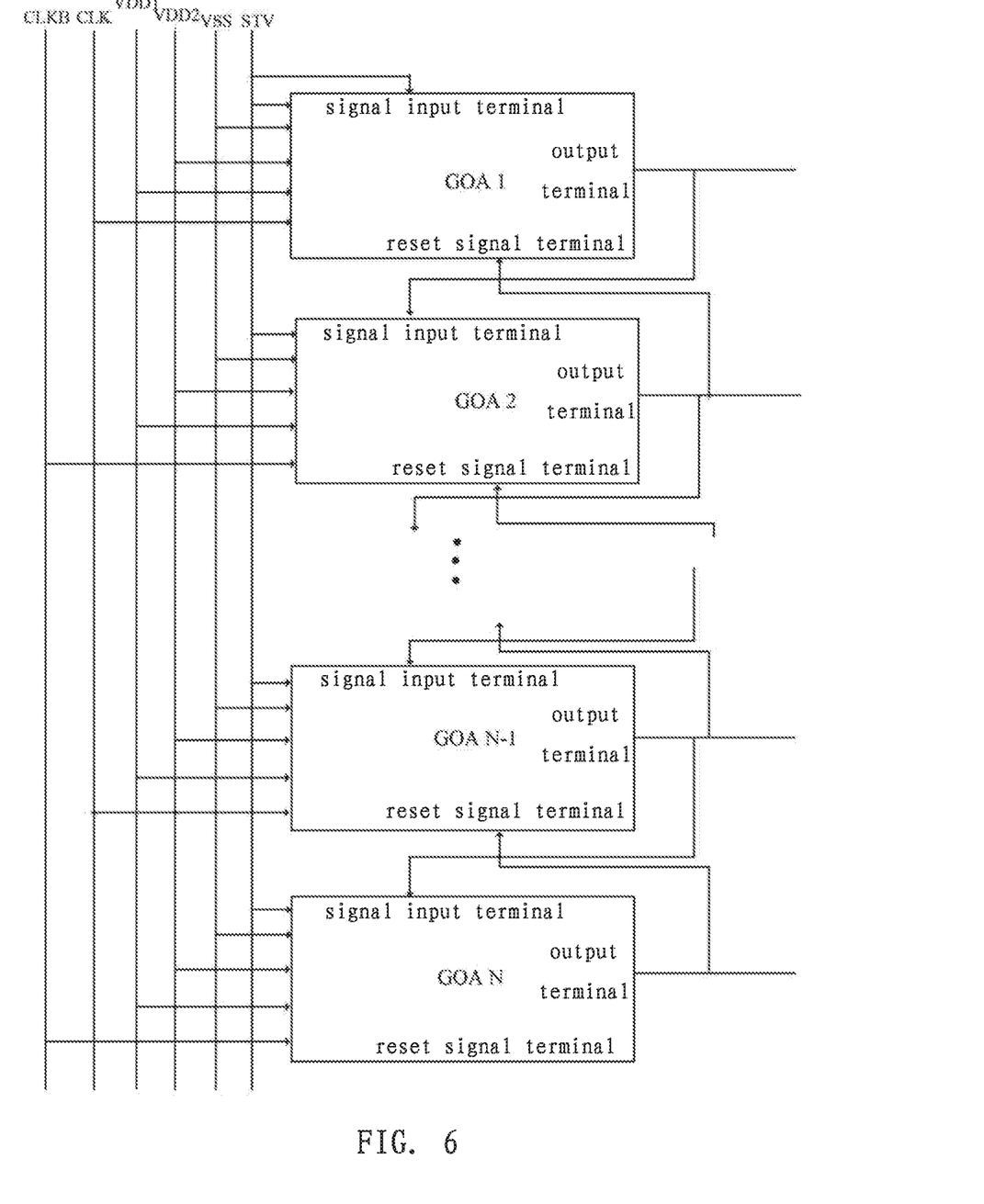
FIG. 6 shows an overall structure of a GOA driving circuit according to an embodiment of the present disclosure.

FIG. 6 shows the overall structure of a GOA driving circuit according to an embodiment of the present disclosure.

The GOA driving circuit shown in FIG. 6 includes N GOA circuits connected in cascade which are the first GOA circuit to the Nth GOA circuit, where N is an integer greater than or equal to two. Each stage of GOA circuit can employ the structure described above.

Hereinto, in said N GOA circuits connected in cascade, the signal input terminal of the first GOA circuit is connected to the frame start signal, and the reset signal terminal of the Nth GOA circuit is connected to the frame start signal.

The signal input terminal of each GOA circuit of the second GOA circuit to the Nth GOA circuit is connected to the output terminal of the GOA circuit at the previous stage adjacent thereto.

The reset signal terminal of each GOA circuit of the first GOA circuit to the N-1th GOA circuit is connected to the output terminal of the GOA circuit at the next stage adjacent thereto.

Hereinto, in the GOA driving circuit, the frame start signal is connected to each stage of GOA circuit.

The driving signal output terminal of the GOA circuit at respective stage is connected to the gate line.

The GOA driving circuit is connected to the corresponding gate line through the driving signal output terminal of the GOA circuit at respective stage, and is configured to sequentially output the scanning signal to the corresponding gate line.

The present disclosure also provides a display device including the GOA driving circuit described above.

Figure 7:
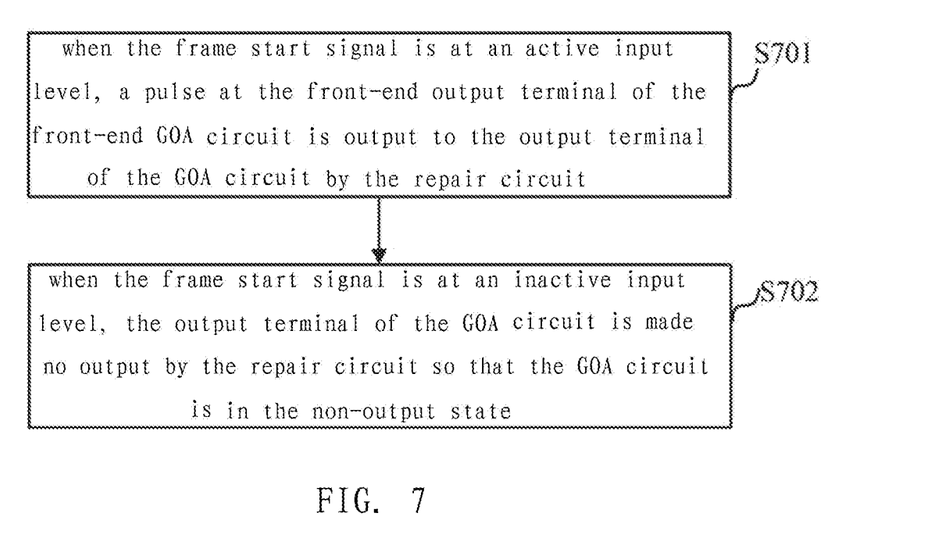
FIG. 7 shows a flowchart of a method of driving a GOA circuit according to an embodiment of the present disclosure.

FIG. 7 shows a flowchart of a method of driving a GOA circuit according to an embodiment of the present disclosure.

The GOA circuit includes a front-end GOA circuit and a repair circuit. As shown in FIG. 7, in step 5701, when the frame start signal is at an active input level, a pulse at the front-end output terminal of the front-end GOA circuit is output to the output terminal of the GOA circuit through the repair circuit.

In step 5702, when the frame start signal is at an inactive input level, the repair circuit makes the output terminal of the GOA circuit having no output so that the GOA circuit is in a non-output state.

Hereinto, the frame start signal is at an active input level at the beginning of each frame.

The present disclosure adds a self-repair structure to the existing GOA architecture, and outputs the front-end output in a rational and selective manner with three TFTs turned on and off, so as to eliminate Multiple-Output condition and shield abnormal interference signals; improve product quality, product yield and product reliability; improve design margin, reduce design difficulty; and achieve the GOA circuit's self-repair function and anti-interference function by performing process on the signal output from the front-end output terminal.

Unless otherwise defined, all terms (including technical and scientific terms) used herein have the same meaning as commonly understood by one of ordinary skill in the art to which this disclosure belongs. It should also be understood that terms such as those defined in a typical dictionary should be construed as having a meaning that is consistent with their meaning in the context of the related art without being interpreted in an idealized or overly formal sense, unless defined expressly herein.

The above is an explanation of the present disclosure and should not be construed as a limitation thereof. Although several exemplary embodiments of the present disclosure have been described, those skilled in the art will readily appreciate that many modifications are possible in the exemplary embodiments without departing from the novel teachings and advantages of the present disclosure. Accordingly, all such modifications are intended to be included within the scope of the present disclosure as defined by the claims. It should be understood that the foregoing is a description of the disclosure and should not be deemed as limiting to the specific embodiments disclosed, and modifications of the disclosed embodiments and other embodiments are intended to be included within the scope of the appended claims. This disclosure is defined by the claims and their equivalents.

This application claims priority of the Chinese Patent Application No.: 201710203914.1 filed on Mar. 30, 2017, the entire disclosure of which is hereby incorporated in full text by reference as part of the present application.

What is claimed is:

1. A GOA circuit, comprising:
a front-end GOA circuit which is connected to a signal input terminal, a reset signal terminal, a first power supply voltage terminal, a second power supply voltage terminal, a third power supply voltage terminal, a clock signal terminal, and a front-end output terminal, and is configured to output a clock signal at the clock signal terminal to the front-end output terminal when an input signal at the signal input terminal is at an active input level; and
a repair circuit which is connected to the front-end output terminal, a frame start signal, the first power supply voltage terminal, and an output terminal of the GOA circuit, and is configured to output a pulse at the front-end output terminal to the output terminal of the GOA circuit when the frame start signal is at an active input level; and to make the output terminal of the GOA circuit having no output so that the GOA circuit is in a non-output state when the frame start signal is at an inactive input level,
wherein the repair circuit comprises:

a first repair control transistor having a gate and a first electrode respectively connected to the frame start signal, and a second electrode connected to a reset node;

a second repair control transistor having a gate connected to the reset node, a first electrode connected to the front-end output terminal, and a second electrode connected to the output terminal of the GOA circuit a first capacitor having a first terminal connected to the reset node; and a third repair control transistor having a gate connected to an output terminal of a GOA circuit at a next stage, a first electrode connected to a second terminal of the first capacitor, and a second electrode connected to the first power supply voltage terminal.

2. The GOA circuit according to claim 1, wherein the front-end GOA circuit comprises:

an input circuit, which is connected to the signal input terminal and a pull-up node, and is configured to transfer the input signal to the pull-up node when the input signal of the signal input terminal is at an active input level;

a reset circuit which is connected to the reset signal terminal, the first power supply voltage terminal, and the pull-up node, and is configured to pull down a pull-up signal at the pull-up node to a power supply voltage at the first power supply voltage terminal when a reset signal at the reset signal terminal is at an active control level;

a pull-down control circuit which is connected to the second power supply voltage terminal, the third power supply voltage terminal, the pull-up node, a pull-down node, and the first power supply voltage terminal, and is configured to control whether a pull-down circuit operates;

the pull-down circuit which is connected to the pull-down node, the pull-up node, the first power supply voltage terminal, and the front-end output terminal, and is configured to pull down voltages of the front-end output terminal and the pull-up node to the power supply voltage of the first power supply voltage terminal when a pull-down signal at the pull-down node is at an active pull-down level; and an output circuit, which is connected to the clock signal terminal, the pull-up node, and the front-end output terminal, and is configured to output the clock signal of the clock signal terminal to the front-end output terminal when the pull-up signal at the pull-up node is at an active pull-up level.

3. The GOA circuit according to claim 2, wherein the input circuit comprises:

an input transistor having a gate and a first electrode respectively connected to the signal input terminal, and a second electrode connected to the pull-up node.

4. The GOA circuit according to claim 2, wherein the reset circuit comprises:

a reset transistor having a gate connected to the reset signal terminal, a first electrode connected to the pull-up node, and a second electrode connected to the first power supply voltage terminal.

5. The GOA circuit according to claim 2, wherein the pull-down control circuit comprises a first pull-down control circuit and a second pull-down control circuit, wherein the pull-down node includes a first pull-down node and a second pull-down node.

6. The GOA circuit according to claim 5, wherein the first pull-down control circuit comprises:

a first pull-down control transistor having a gate connected to a first pull-down control node, a first electrode connected to the second power supply voltage terminal, and a second electrode connected to the first pull-down node;

a second pull-down control transistor having a gate connected to the pull-up node, a first electrode connected to the first pull-down node, and a second electrode connected to the first power supply voltage terminal;

a third pull-down control transistor having a gate and a first electrode respectively connected to the second power supply voltage terminal, and a second electrode connected to the first pull-down control node; and a fourth pull-down control transistor having a gate connected to the pull-up node, a first electrode connected to the first pull-down control node, and a second electrode connected to the first power supply voltage terminal, and the second pull-down control circuit includes:

a fifth pull-down control transistor having a gate connected to a second pull-down control node, a first electrode connected to the third power supply voltage terminal, and a second electrode connected to the second pull-down node;

a sixth pull-down control transistor having a gate connected to the pull-up node, a first electrode connected to the second pull-down node, and a second electrode connected to the first power supply voltage terminal;

a seventh pull-down control transistor having a gate and a first electrode respectively connected to the third power supply voltage terminal, and a second electrode connected to the second pull-down control node; and an eighth pull-down control transistor having a gate connected to the pull-up node, a first electrode connected to the second pull-down control node, and a second electrode connected to the first power supply voltage terminal.

7. The GOA circuit according to claim 5, wherein the pull-down circuit includes a first pull down circuit and a second pull-down circuit.

8. The GOA circuit according to claim 7, wherein the first pull-down circuit comprises:

a first node pull-down transistor having a gate connected to the first pull-down node, a first electrode connected to the pull-up node, and a second electrode connected to the first power supply voltage terminal; and a first output pull-down transistor having a gate connected to the first pull-down node, a first electrode connected to the front-end output terminal, and a second electrode connected to the first power supply voltage terminal, and the second pull-down circuit includes:

a second node pull-down transistor having a gate connected to the second pull-down node, a first electrode connected to the pull-up node, and a second electrode connected to the first power supply voltage terminal; and a second output pull-down transistor having a gate connected to the second pull-down node, a first electrode connected to the front-end output terminal, and a second electrode connected to the first power supply voltage terminal.

9. The GOA circuit according to claim 2, wherein the output circuit comprises:

an output transistor having a gate connected to the pull-up node, a first electrode connected to the clock signal terminal, and a second electrode connected to the front-end output terminal; and a second capacitor having a first terminal connected to the pull-up node and a second terminal connected to the front-end output terminal.

10. The GOA circuit according to claim 1, wherein at a beginning of each frame, the frame start signal is at an active input level.

11. A driving method of a GOA circuit, the GOA circuit comprising the GOA circuit according to claim 1, the method comprising:

when the frame start signal is at an active input level, outputting, by the repair circuit, a pulse at the front-end output terminal of the front-end GOA circuit to the output terminal of the GOA circuit; and when the frame start signal is at an inactive input level, making, by the repair circuit, the output terminal of the GOA circuit having no output so that the GOA circuit is in a non-output state.

12. The driving method according to claim 11, wherein at a beginning of each frame, the frame start signal is at an active input level.

13. A display device, comprising a GOA driving circuit which comprises N GOA circuits connected in cascade, said N GOA circuits being a first GOA circuit to an Nth GOA circuit, each GOA circuit being the GOA circuit according to claim 1, where N is an integer greater than or equal to two.

14. The display device according to claim 13, wherein among said N GOA circuits connected in cascade, a signal input terminal of the first GOA circuit is connected to the frame start signal, and a reset signal terminal of the Nth GOA circuit is connected to the frame start signal, a signal input terminal of each GOA circuit of a second GOA circuit to the Nth GOA circuit is connected to an output terminal of a GOA circuit at a previous stage adjacent thereto, a reset signal terminal of each GOA circuit of the first GOA circuit to an N-1th GOA circuit is connected to an output terminal of the GOA circuit at a next stage adjacent thereto.

15. The display device according to claim 14, wherein in the GOA driving circuit, the frame start signal is input to each stage of the GOA circuit.

* * * * *